United States Patent [19]

Fathimulla et al.

[11] Patent Number: 5,338,394
[45] Date of Patent: Aug. 16, 1994

[54] METHOD FOR ETCHING INDIUM BASED III-V COMPOUND SEMICONDUCTORS

[75] Inventors: Mohammed A. Fathimulla, Ellicott City; Thomas C. Loughran, Columbia, both of Md.

[73] Assignee: AlliedSignal Inc., Morris Township, Morris County, N.J.

[21] Appl. No.: 877,456

[22] Filed: May 1, 1992

[51] Int. Cl.$^5$ ............................. H01L 21/306
[52] U.S. Cl. ............................. 156/643; 156/646
[58] Field of Search ......................... 156/643, 646

[56] References Cited

U.S. PATENT DOCUMENTS

| | | | |
|---|---|---|---|
| 4,445,218 | 4/1984 | Coldren | 372/44 |
| 4,529,685 | 7/1985 | Borodovsky | 430/311 |
| 4,878,993 | 11/1989 | Rossi et al. | 156/643 |
| 4,927,785 | 5/1990 | Theeten et al. | 437/225 |
| 5,034,092 | 7/1991 | Lebby | 156/643 |
| 5,068,007 | 11/1991 | Rogers | 156/643 |
| 5,074,955 | 12/1991 | Henry | 156/643 |

OTHER PUBLICATIONS

Fathimulla et al "Reactive Ion Etching of Indium-Based III-V Materials Using Methane-Hydrogen-Argon Mixtures" abstracted in *Chemical Abstracts* vol. 112, #63, 419V (1990).

*Primary Examiner*—Olik Chaudhuri
*Assistant Examiner*—Trung Dang
*Attorney, Agent, or Firm*—Verne E. Kreger, Jr.

[57] ABSTRACT

InP is etched by reactive ion etching using a mixture of $SiCl_4$ and $CH_4$ or a mixture of $SiCl_4$ and $H_2$. A mask is placed on the InP and then it is placed into a RIE chamber having a pressure between approximately 5 mTorr and approximately 50 mTorr. The InP substrate is etched at a substrate temperature of less than 150° C.

14 Claims, 2 Drawing Sheets

METHOD FOR ETCHING INDIUM BASED III-V COMPOUND SEMICONDUCTORS

BACKGROUND OF THE INVENTION

1. Field of the Invention

The present invention relates to semiconductors, more specifically it relates to etching Indium based III-V compound semiconductors.

2. Description of the Related Art

In the past chlorine based gases were used to etch indium phosphide (InP) using reactive ion etching (RIE). Unfortunately, this process produced indium chloride ($InCl_n$ n=1,2,3) as a by-product. The $InCl_n$ has a low vapor pressure and remained on the surface of the semiconductor. In an effort to remove the $InCl_n$, the semiconductor was heated to above 150° C., however, this procedure was unsatisfactory because such high temperatures damaged the semiconductor device being fabricated and limited the availability of suitable masks.

RIE of InP has been carried out using a mixture of methane ($CH_4$) and hydrogen ($H_2$) in which volatile organometallic group III compounds are formed. The etch rates that were achieved using this method were approximately 1000 Å/min. An etch rate of 1000 Å/min is too low to etch structures such as via holes of the order of 100 μm.

SUMMARY OF THE INVENTION

The present invention provides a method for etching Indium based III-V compound semiconductors. The method involves placing a mask on the compound semiconductor and then placing the compound semiconductor and mask in a chamber having a pressure between approximately 1 mTorr and approximately 100 mTorr. A gas selected from the group consisting of $SiCl_4$, $BCl_3$, HBr, $SiHCl_3$, $SiHCl_2$, $C_2H_5Cl_3$ and $CHCl_3$ is introduced into the chamber. The temperature of the compound semiconductor is maintained at a level that is less than approximately 150° C.

The present invention solves the aforementioned problems by reactive ion etching InP using gases such as a mixture of $SiCl_4$ and $CH_4$, or $SiCl_4$ and $H_2$ at temperatures between approximately 70° C. and approximately 125° C. to achieve an etch rate between approximately 0.5 μm/min and approximately 1.0 μm/min. This method solves the aforementioned problems by etching at a low temperature while providing an etch rate that is acceptable for etching structures such as via holes that are of the order of 100 μm. Etching at a lower temperature decreases the probability of damaging the device being fabricated and increases the availability of suitable masks.

The gas compositions utilized in etching are not limited to $SiCl_4$, gases such as $BCl_3$, HBr, $SiHCl_3$, $SiHCl_2$, $C_2H_5Cl_3$ and $CHCl_3$ may be used. In addition, the substrate being etched is not limited to InP, other Indium based III-V compound semiconductors such as InAs and InSb may be used. The etching is not limited to binary substrates. Ternary substrates such as InGaAs, InAlAs, InAsP, InGaSb and InAlP, and quaternary substrates such as InGaAsP and InAlGaAs may also be etched.

DESCRIPTION OF THE PREFERRED EMBODIMENTS

The present invention can be used in techniques involving reactive ion etching (RIE) or electron cyclotron resonance (ECR) etching. The present invention etches Indium based III-V compound semiconductors using a mixture of $SiCl_4$ and $CH_4$, or $SiCl_4$ and $H_2$. Gases such as $BCl_3$ or HBr can be used in place of the $SiCl_4$. In addition, gases such as $SiHCl_3$, $SiHCl_2$, $C_2H_5Cl_3$ 3 or $CHCl_3$ can be used without mixing them with the $CH_4$, $H_2$ or Ar, and thereby provide a less complex etching procedure while avoiding flammable gases such as $CH_4$ and $H_2$.

Figure 1:
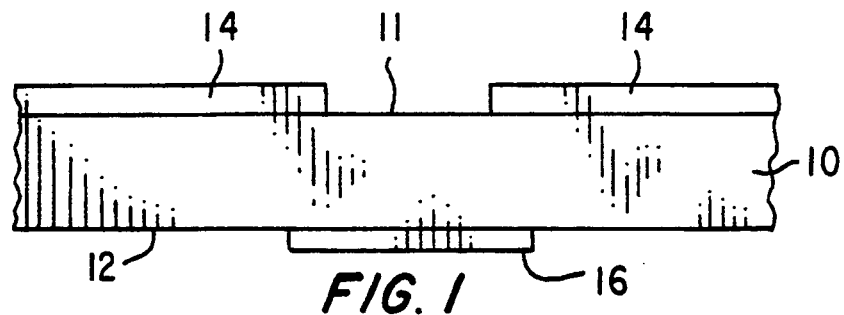
FIG. 1 illustrates an unetched layer of indium phosphide.

FIG. 1 illustrates unetched Indium based III-V substrate 10 with back surface 11 and front surface 12. Mask 14 is on back surface 11 of substrate 10. Substrate 10 may be InP, InAs, InSb or other Indium based III-V compound semiconductors. Layer 16 is a metal layer or contact deposited on front surface 12 of the substrate. Mask 14 may be any convenient material that etches at a rate that is slower than the rate of substrate 10. Mask 14 may be formed using material such as titanium, nickel, $SiO_2$, $Si_3N_4$, or photoresist which is preferably stabilized using deep UV fight.

Figure 2:
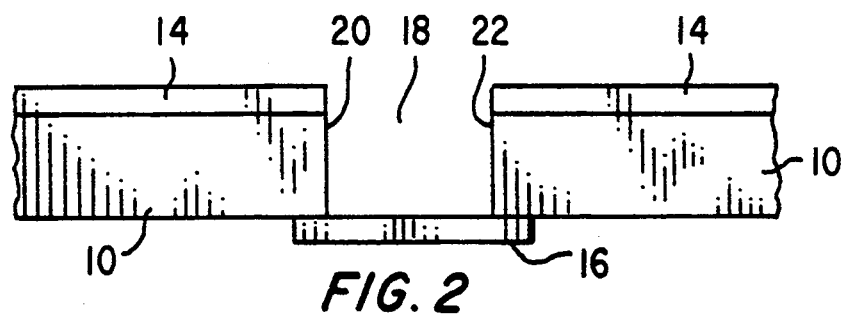
FIG. 2 illustrates an etched layer of indium phosphide.

Substrate 10 and mask 14 are placed into an PIE or ECR chamber to produce via hole 18. FIG. 2 illustrates via hole 18. The depth of via hole 18 is approximately 100 μm. In an RIE chamber, the bottom plate is powered using a radio frequency source. The frequency can be 13.52 MHz, however, other frequencies can be used. The mount of power supplied can be any amount that is suitable for RIE, but is preferable to use between 100 and 1000 watts, and it is more preferable to use between 100 and 400 watts. The etch rate increases with the amount of power supplied, however, the rate is limited by the etch rate of mask 14. The pressure maintained inside the chamber may be any pressure that is suitable for RIE, but it is preferable to use between 5 mTorr and 50 mTorr. It is more preferable to use between 25 and 50 mTorr. In a preferred embodiment, $SiCl_4$ and $H_2$, or $SiCl_4$ and $CH_4$ should be introduced as a gas with 75% $SiCl_4$ and 25% $H_2$, or 90% $SiCl_4$ and 10% $CH_4$. It is preferable to use a total flow rate of 40 Standard cubic centimeters per minute (Sccm), and to maintain a temperature of approximately 120° C.

If ECR is used, substrate 10 with mask 14 are placed in the ECR chamber. After placing the substrate with mask into the chamber, $H_2$ or $CH_4$ is introduced into the ECR region, and $SiCl_4$ is introduced at the bottom close to substrate 10. Microwave power is then coupled into the ECR region. The microwave source can have a frequency of 2.45 GHz. Any mount of power that is suitable for ECR can be used, but is preferable to use between 100 and 1000 watts. It is more preferable to use 500 watts. The pressure maintained in the ECR chamber can be any pressure that is suitable for ECR, but is preferable to use between 1 mTorr and 5 mTorr. The substrate can be biased with RF power at 13.52 MHz to enhance the etch rate. In a preferred embodiment, SiCl₄ and H₂ or CH₄ should be introduced as a gas with 25% H₂ and 75% SiCl₄, or 10% CH₄ and 90% SiCl₄. It is preferable to use a total flow rate of 40 Sccm and to maintain a temperature of less than approximately 150° C.

Figure 3:
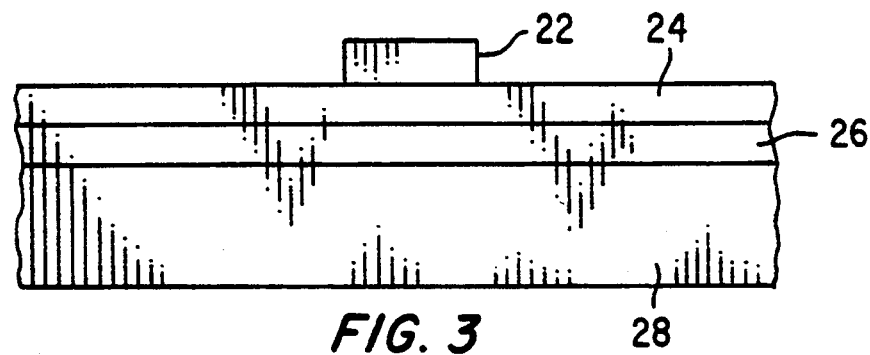
FIG. 3 illustrates an unetched layer of polycrystaline Si.
Figure 4:
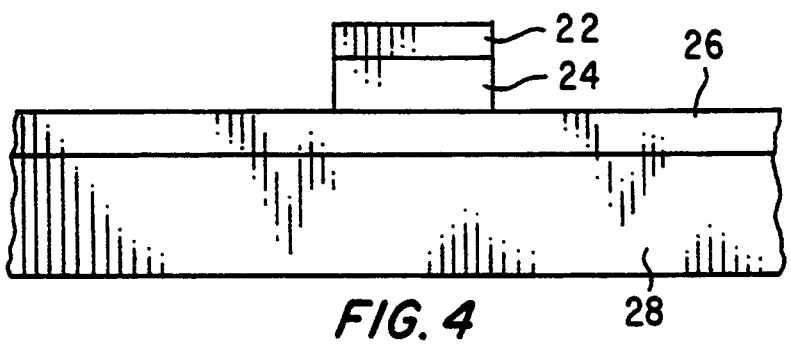
FIG. 4 illustrates an etched layer of polycrystaline Si.

The present invention can be used to etch Si, amorphous Si and polycrystaline Si. In the case of polycrystaline Si, a selectivity of greater than 20 can be achieved for polycrystaline Si over $SiO_2$. FIG. 3 illustrates unetched polycrystaline Si. Mask 22 is placed on polycrystaline Si layer 24. Polycrystaline Si layer 24 is on top of $SiO_2$ layer 26 and layer 26 is on top of Si substrate 28. A selectivity of greater than 20 can be achieved for polycrystaline Si over $SiO_2$ by RIE using SiCl₄, and H₂ or CH₄. The same selectivity can be achieved for amorphous Si over $SiO_2$. FIG. 4 illustrates the etched polycrystaline Si layer that results from the RIE.

Figure 5:
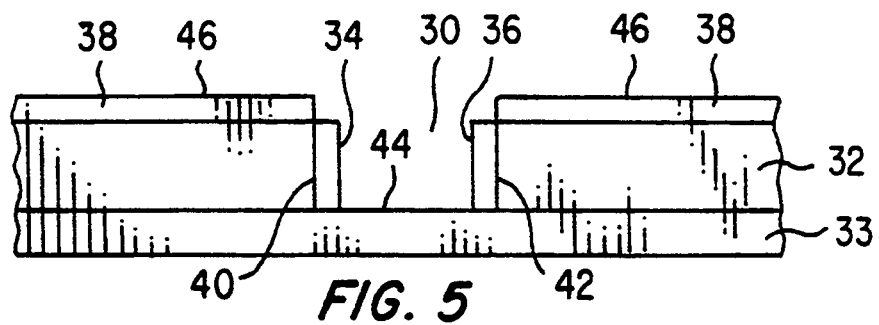
FIG. 5 illustrates a channel with silicon oxide sidewalls.

The present invention can also be used for etching trenches in Indium based III-V semiconductors in order to grow epitaxial layers in selected areas. When etching trenches, it is preferable to use a higher pressure and a higher percentage of H₂ or CH₄. FIG. 5 illustrates channel 30 etched into laser structure (InGaAsP/InP) 32 which is on a front surface of substrate 33. Substrate 33 can be an InP substrate. Channel 30 contains sidewalls 34 and 36 which are formed using $SiO_2$. By using this construction and then growing an FET (heterostructure FET) in channel 30, a device such as a laser and FET can be produced. This structure is formed by putting mask 38 on the top surface of structure 32. Mask 38 is preferably a $Si_3N_4$ mask. Mask 38 is then patterned to allow etching of channel 30 using reactive ion etching with a mixture of SiCl₄ and H₂. It is preferable to use a pressure that is between 50 mTorr and 100 mTorr, a greater than 30% H₂ concentration, and approximately 300 watts of radio frequency power. It is also preferable to use a flow rate of 50 Sccm and to maintain a temperature of approximately 125° C. After the etching is complete, $SiO_2$ is deposited over the entire structure which results in $SiO_2$ being deposited on mask 38, sides surfaces 40 and 42 of channel 30 and bottom surface 44 of channel 30. The $SiO_2$ is then reactive ion etched from mask 38 and bottom surface 44 to leave only sidewalls 34 and 36. The RIE is carried out using a mixture of CHF₃ and O₂ at approximately 20 mTorr. It is preferable to use a mixture with a 10% concentration of O₂. It is also preferable to use a total flow rate of 30 Sccm and approximately 100 watts of radio frequency power. In this manner, an insulating structure can be placed between a crystal grown within channel 30 and side surfaces 40 and 42 to produce devices such as a photodiode and FET, an FET and HBT (heterojunction bipolar transistor), and an FET and RTD (resonant tunneling diode).

Figure 6:
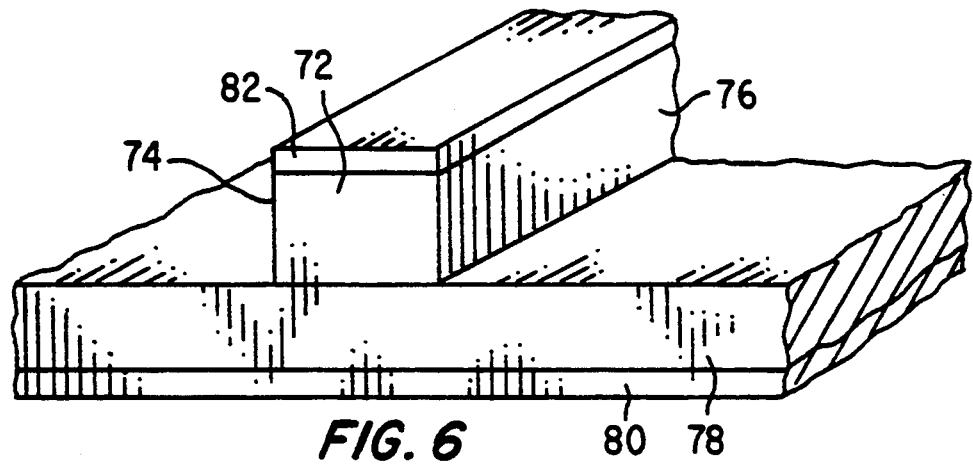
FIG. 6 illustrates a laser structure with smooth facets.

For applications such as lasers, the present invention can be used to produce a smooth etched facet that has a depth between 1 μm and 3 μm. FIG. 6 illustrates laser structure 72 with smooth facets 74 and 76, substrate 78 and contacts 80 and 82. Smooth surfaces can be produced by reactive ion etching using a mixture of SiCl₄, and H₂ or CH₄. The mixture should have a high percentage of H₂ or CH₄. The RIE should be carried out at a pressure greater than or equal to 70 mTorr, at a temperature of approximately 120° C., and with approximately 200 watts of radio frequency power being provided. Other combinations of pressure, gas composition and temperature can be used to give smooth vertical laser facets.

I claim:

1. A method for etching Indium based III-V compound semiconductors, comprising the steps of:
    (a) placing a mask on the Indium based III-V compound semiconductor;
    (b) placing the Indium based III-V compound semiconductor and said mask in a chamber having a pressure between approximately 1 mTorr and approximately 100 mTorr;
    (c) introducing a first gas selected from the group consisting of SiCl₄, BCl₃, and HBr into said chamber;
    (d) introducing a second gas selected from the group consisting of CH₄ and H₂ into said chamber;
    (e) maintaining the Indium based III-V compound semiconductor at a temperature of less than approximately 150° C.; and
    (f) exposing said semiconductor to a gas plasma comprising said first gas and said second gas;
    whereby said gas plasma etches said semiconductor at a rate of between about 0.5 μm/min to about 1.0 μm/min.

2. The method of claim 1, further comprising the step of selecting the Indium based III-V compound semiconductor from the group consisting of InP, InAs and InSb.

3. The method of claim 2, further comprising the step of selecting InP as the Indium based III-V compound semiconductor.

4. The method of claim 1, further comprising generating said gas plasma in a reactive ion etching system.

5. The method of claim 1, further comprising generating said gas plasma in an electron cyclotron resonance system.

6. The method of claim 4, further comprising the step of selecting the Indium based III-V compound semiconductor from the group consisting of InP, InAs and InSb.

7. The method of claim 5, further comprising the step of selecting the Indium based III-V compound semiconductor from the group consisting of InP, InAs and InSb.

8. The method of claim 6, further comprising the step of maintaining the Indium based III-V compound semiconductor at a temperature of less than approximately 120° C.

9. A method for etching Indium based III-V compound semiconductors, comprising the steps of:
    (a) selecting InP as the Indium based III-V compound semiconductor;
    (b) placing a mask on the Indium based III-V compound semiconductor;
    (c) placing the Indium based III-V compound semiconductor and said mask in a chamber having a pressure between approximately 1 mTorr and approximately 5 mTorr;
    (d) introducing a first gas selected from the group consisting of SiCl₄, BCl₃, and HBr into said chamber;
    (e) introducing a second gas selected from the group consisting of CH₄ and H₂ into said chamber;
    (f) maintaining the Indium based III-V compound semiconductor at a temperature of less than approximately 150° C; and
    (g) electron cyclotron resonance etching the Indium based III-V compound semiconductor;
    whereby a gas plasma generated by said electron cyclotron resonance etching etches said semiconductor at a rate between about 0.5 μm/min to about 1.0 μm/min.

10. A method for etching Indium based III-V compound semiconductors, comprising the steps of:
(a) selecting InP as the Indium based III-V compound semiconductor;
(b) placing a mask on the Indium based III-V compound semiconductor;
(c) placing the Indium based III-V compound semiconductor and said mask in a chamber having a pressure between approximately 5 mTorr and approximately 100 mTorr;
(d) introducing a first gas selected from the group consisting of $SiCl_4$, $BCl_3$ and $HBr$ into said chamber;
(e) maintaining the Indium based III-V compound semiconductor at a temperature of less than approximately 150° C.;
(f) introducing a Second gas selected from the group consisting of $CH_4$ and $H_2$ into said chamber; and
(g) reactive ion etching the Indium based III-V compound semiconductor.
whereby a gas plasma generated by said reactive ion etching etches said semiconductor at a rate of between about 0.5 $\mu$m/min to about 1.0 $\mu$m/min.

11. A method for etching Indium based III-V compound semiconductors, comprising the steps of:
(a) placing a mask on the Indium based III-V compound semiconductor;
(b) placing the Indium based III-V compound semiconductor and said mask in a chamber having a pressure between approximately 1 mTorr and approximately 100 mTorr;
(c) introducing a gas selected from the group consisting of $SiHCl_3$, $SiHCl_2$, $C_2H_5Cl_3$ and $CHCl_3$ into said chamber;
(d) maintaining the Indium based III-V compound semiconductor at a temperature of less than approximately 150° C.; and
(f) exposing said semiconductor to a gas plasma comprising said gas;
whereby said gas plasma etches said semiconductor at a rate of between about 0.5 $\mu$m/min to about 1.0 $\mu$m/min.

12. The method of claim 11, further comprising the step of reactive ion etching the Indium-based III-V compound semiconductor.

13. The method of claim 11, further comprising the step of electron cyclotron resonance etching the Indium based III-V compound semiconductor.

14. The method of claim 11, further comprising the step of introducing a second gas selected from the group consisting of $CH_4$ and $H_2$ into said chamber.

* * * * *